(12) United States Patent
De Geronimo et al.

(10) Patent No.: US 9,071,219 B2
(45) Date of Patent: Jun. 30, 2015

(54) SHAPER DESIGN IN CMOS FOR HIGH DYNAMIC RANGE

(75) Inventors: Gianluigi De Geronimo, Syosset, NY (US); Shaorui Li, Yaphank, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 14/115,308

(22) PCT Filed: Apr. 4, 2012

(86) PCT No.: PCT/US2012/032199
§ 371 (c)(1),
(2), (4) Date: Feb. 20, 2014

(87) PCT Pub. No.: WO2012/138781
PCT Pub. Date: Oct. 11, 2012

(65) Prior Publication Data
US 2014/0184319 A1 Jul. 3, 2014

Related U.S. Application Data

(60) Provisional application No. 61/471,392, filed on Apr. 4, 2011.

(51) Int. Cl.
| | |
|---|---|
| H03K 5/00 | (2006.01) |
| H03H 1/00 | (2006.01) |
| H03F 1/34 | (2006.01) |
| H03F 3/21 | (2006.01) |
| H03F 3/70 | (2006.01) |
| H03H 11/12 | (2006.01) |

(52) U.S. Cl.
CPC .............. *H03H 1/0007* (2013.01); *H03F 1/34* (2013.01); *H03F 3/211* (2013.01); *H03F 3/70* (2013.01); *H03F 2200/144* (2013.01); *H03F 2200/408* (2013.01); *H03H 11/1217* (2013.01)

(58) Field of Classification Search
USPC .................................. 327/551–559, 336–337
See application file for complete search history.

(56) References Cited

U.S. PATENT DOCUMENTS

| | | | |
|---|---|---|---|
| 6,373,332 B2 * | 4/2002 | Kawai ........................... 327/556 |
| 7,075,364 B2 * | 7/2006 | Gudem et al. ................. 327/552 |
| 7,392,028 B2 * | 6/2008 | Goddard .................... 455/234.1 |
| 2003/0160647 A1 | 8/2003 | Easwaran et al. | |

(Continued)

OTHER PUBLICATIONS

International Search Report and Written Opinion for application PCT/US2012/032199, dated Sep. 28, 2012, 7 pages.

(Continued)

*Primary Examiner* — Dinh Le
(74) *Attorney, Agent, or Firm* — Dorene M. Price

(57) ABSTRACT

An analog filter is presented that comprises a chain of filter stages, a feedback resistor for providing a negative feedback, and a feedback capacitor for providing a positive feedback. Each filter stage has an input node and an output node. The output node of a filter stage is connected to the input node of an immediately succeeding filter stage through a resistor. The feedback resistor has a first end connected to the output node of the last filter stage along the chain of filter stages, and a second end connected to the input node of a first preceding filter stage. The feedback capacitor has a first end connected to the output node of one of the chain of filter stages, and a second end connected to the input node of a second preceding filter stage.

12 Claims, 17 Drawing Sheets

(56) References Cited

U.S. PATENT DOCUMENTS

2005/0232101 A1 10/2005 Hasegawa
2009/0302943 A1 12/2009 Chen

OTHER PUBLICATIONS

Buzzetti, S. & C. Guazzoni, "A Novel Compact Topology for High-Resolution CMOS/BiCMOS Spectroscopy Amplifiers", IEEE Transactions on Nuclear Science, Oct. 2005, p. 1611-1616, vol. 52-5.
G. Bertuccio, et al., "'R-lens filter': An (RC)n current-mode lowpass filter", Electronic Letters, Jul. 1999, p. 1209-1210, vol. 35-15.
Jung, I.I., et al., "Design of high-linear CMOS circuit using a constant transconductance method for gamma-ray spectroscopy system", Nuclear Instruments and Methods in Physics Research, 2011, p. 277-281.
Fiorini, C., "Integrated RC Cell for Time-Invariant Shaping Amplifiers". IEEE Transactions on Nuclear Science, Oct. 2004, p. 1953-1960, vol. 51-5.
Chase, R.L., et al., "8-channel CMOS preamplifier and shaper with adjustable peaking time and automatic pole-zero cancellation", Nuclear Instruments and Methods in Physics Research, 1998, p. 328-331.
Ohkawa, S., et al., "Direct Synthesis of the Gaussian Filter for Nuclear Pulse Amplifiers", Nuclear Instruments and Methods, 1976, p. 85-92.
Noulis, T., et al., "Detailed study of particle detectors OTA-based CMOS Semi-Gaussian shapers", Nuclear Instruments and Methods in Physics Research, 2007, p. 469-478.
G. F. Knoll, "Radiation detection and measurement", 3rd ed., John Wiley & Sons, 2000, 802 pages, [Bibliographic Information & Table of Contents submitted].
A. F. Arbel, "The second stage noise contribution of a nuclear pulse amplifier", IEEE Trans. Nucl. Set., vol. 15, No. 5, pp. 2-5, 1968.
V. Radeka, "Low noise techniques in detectors", Ann. Rev. Nucl. Part. Sci., vol. 38, pp. 217-277, 1988.
E. Gatti and P. F. Manfredi, "Processing the signals from solid state detectors in element, particle physics", La Rivista del Nuovo Cimento, vol. 9, pp. 1-147, 1986.
V. Radeka, "Signal processing for particle detectors", H. Schopper editor, Landolt-Bornstein, New Series 1/21B1, in press, 2011, p. 3.6-1-3.6-32.

\* cited by examiner

SHAPER DESIGN IN CMOS FOR HIGH DYNAMIC RANGE

CROSS-REFERENCE TO RELATED APPLICATIONS

This application is a 371 of International Application No. PCT/US12/32199 filed Apr. 4, 2012, which in turn claims priority to Provisional Application No. 61/471,392 filed on Apr. 4, 2011, the entirety of both of these applications is hereby incorporated by reference in their entirety.

STATEMENT OF GOVERNMENT LICENSE RIGHTS

The present invention was made with government support under contract number DE-AC02-98CH10886 awarded by the U.S. Department of Energy. The United States government has certain rights in the invention.

TECHNICAL FIELD OF THE INVENTION

The present invention relates to electronic circuit design in Complementary Metal Oxide Semiconductor (CMOS), and more particularly to shaper design in CMOS for high dynamic range.

BACKGROUND

Front-end electronics for capacitive sensors typically includes a preamplifier followed by a filter. The preamplifier provides low-noise amplification of the signals induced in the sensor electrodes. The filter, by properly limiting the signal bandwidth, maximizes the Signal-to-Noise (S/N) ratio. Additionally the filter limits the duration of the output signal associated with the measured event and, for those sensors where the induced signal is relatively slow, it maximizes the signal amplitude, i.e. it minimizes the ballistic deficit, as described in G. F. Knoll, "Radiation detection and measurement", 3rd ed., John Wiley & Sons, 2000, which is incorporated by reference in its entirety as if fully set forth in this specification.

Filters can be either time-variant or time-invariant. In electronics for radiation sensors, time-invariant filters are frequently referred to as "shapers" since, in a time-domain view, they "shape" the response associated with events. Filters can also be synthesized digitally, even though in most cases this is impractical due to constraints from power and real-estate budgets.

S/N ratio and dynamic range are important parameters reflecting performance of a shaper. In the following, we analyze classical shapers based on voltage feedback with passive components with respect to noise and dynamic range. Charge amplifiers, along with providing low-noise amplification, offer a low input impedance (i.e., virtual ground) which stabilizes the potential of a sensor electrode and reduces inter-electrode cross-talk. A charge amplifier 100 is schematized in FIG. 1, where we assume an ideal voltage amplifier with infinite gain and bandwidth. A finite gain and bandwidth would have negligible consequence on our analysis, if the dc loop gain is high and the rise time is a small fraction of the peaking time.

The current $I_i$ induced in the sensing electrode is amplified with current gain (or charge gain) $A_c$ equal to the ratio of the feedback impedance $Z_f$ and the coupling impedance $Z_c$. This ratio (i.e., the gain $A_c$) must be a real number, in order to avoid undesired tails in the output current $I_s$ injected in the next stage. The output current $I_s$ is injected, with opposite polarity, into the next stage, which offers another virtual ground and represents the input stage of a shaper 110. The current (or charge) is then filtered and converted into a voltage $V_o$ with transfer function $Z_s$. It is followed by further processing such as discrimination, peak- or time-detection, and/or counting. It is worth noting that the charge amplifier 100 can be realized using two or more charge-amplification stages with gains $A_{c1}$, $A_{c2}$, ..., and overall charge gain $A_c$ is given by the product of those. This is usually done when large values of $A_c$ are required, such as for sensors generating very small signals.

For simplicity we assume for $Z_f$ an infinite resistive component and a finite capacitive component $C_f$. This is justified considering that designers tend to keep the resistive component as high as possible in order to minimize the parallel noise contribution at the front-end. The coupling impedance will be capacitive according to $C_c = C_f A_c$. We also assume, initially, that the input stage of the shaper 110 is realized using a transimpedance amplifier with feedback impedance $Z_1 = R_1 // C_1$, providing the first pole of the shaper with time constant $\tau_1 = R_1 C_1$. Finally, we assume that the shaper amplifiers are characterized by infinite gain and are noiseless. The latter is justified by the fact that, in most practical cases, the noise contribution from the amplifiers can be made negligible by increasing the size and power of active devices. If this is not easy to achieve, then the noise from the amplifiers must be taken into account. The configuration resulting from these assumptions is shown in FIG. 2. FIG. 2 is a schematic circuit of a charge amplifier 210 assuming a capacitive feedback for the charge amplifier 210 and a single-pole transimpedance amplifier as an input stage 220 of a shaper 200, where the output waveform $V_1$ in response to a charge Q is also shown, with peak amplitude $Q \cdot A_c / C_1$. The output $V_1$ may be input into a subsequent stage 230 of the shaper 200.

Starting from these assumptions and from the configuration in FIG. 2, we can calculate the contribution to the Equivalent Noise Charge (ENC) of the first stage 220 of the shaper 200. The noise contribution comes from the dissipative component $R_1$ of the shaper, as described in A. F. Arbel, "The second stage noise contribution of a nuclear pulse amplifier", IEEE Trans. Nucl. Sci., vol. 15, no. 5, pp. 2-5, 1968, which is incorporated by reference in its entirety as if fully set forth in this specification. The parallel noise spectral density of $R_1$ is given by $4kT/R_1$ and it can be reported as an equivalent parallel noise generator at the input of the charge amplifier 210 by scaling it with the square of the charge gain $A_c$. It must be kept in mind that this is done for calculation purposes and the actual noise source is further down in the channel, not to be confused with the physical sources of parallel noise at the input. It follows the contribution to the ENC of $R_1$, given by:

$$ENC_{s1}^2 = \frac{a_p}{A_c^2} \frac{4kT}{R_1} \tau_p \quad (1)$$

where $a_p$ is the ENC coefficient for white parallel noise, as described in V. Radeka, "Low noise techniques in detectors", Ann. Rev. Nucl. Part. Sci., vol. 38, pp. 217-277, 1988, and in E. Gatti and P. F. Manfredi, "Processing the signals from solid state detectors in elementary particle physics", La Rivista del Nuovo Cimento, vol. 9, pp. 1-147, 1986, and in V. Radeka, "Signal processing for particle detectors", H. Schopper editor, Landolt-Bornstein, New Series I/21B1, in press, each of which is incorporated by reference in its entirety as if fully set forth in this specification, and $\tau_p$ is the peaking time (1% to peak) of the shaped signal. It is worth noting that an analysis based on front-end amplifier without feedback would give $A_c$ dependent on the input capacitance, as described, for example, in FIG. 6.11 of V. Radeka, "Signal processing for particle detectors", H. Schopper editor, Landolt-Bornstein, New Series I/21B1, in press, which is not the case for the charge amplifier configuration in FIG. 2. From Equation (1) it can be observed that the contribution decreases as $A_c$ increases. Since the peaking time is proportional to the time constant, $\tau_p = \eta_p R_1 C_1$, we can write:

$$ENC_{s1}^2 = \frac{a_p}{A_c^2} \frac{4kT}{R_1} \eta_p R_1 C_1 = \frac{a_p \eta_p}{A_c^2} 4kTC_1 \qquad (2)$$

where $\eta_p$ depends on the type of shaping. Table I includes coefficients for unipolar shapers with real (R) and complex-conjugate (C) poles in different orders. Table I summarizes the values of $a_p$ and $\eta_p$ for semi-Gaussian shapers with real poles (even and odd) and complex conjugate poles (odd only) where the input stage is the real pole. Also included in Table I are the coefficient $\chi$, which takes into account the noise contribution of the next stages, and the Relative Dynamic Range (RDR). In Table I are also reported $a_w$, i.e., the ENC coefficient for white series noise, and the coefficients $\chi$ and RDR, which will be described later in this application.

TABLE I

|  | RU-2 | RU-3 | RU-4 | RU-5 | RU-6 | RU-7 | CU-2 | CU-3 | CU-4 | CU-5 | CU-6 | CU-7 |
|---|---|---|---|---|---|---|---|---|---|---|---|---|
| $a_w$ | 0.92 | 0.82 | 0.85 | 0.89 | 0.92 | 0.94 | 0.93 | 0.85 | 0.91 | 0.96 | 1.01 | 1.04 |
| $a_p$ | 0.92 | 0.66 | 0.57 | 0.52 | 0.48 | 0.46 | 0.88 | 0.61 | 0.51 | 0.46 | 0.42 | 0.40 |
| $\eta_p$ | 1 | 1.92 | 2.74 | 3.47 | 4.13 | 4.73 | n/a | 1.79 | n/a | 2.95 | n/a | 3.76 |
| $a_p \eta_p$ | 0.92 | 1.27 | 1.56 | 1.81 | 1.98 | 2.18 | n/a | 1.09 | n/a | 1.355 | n/a | 1.503 |
| $\chi$ | 1 | 1.13 | 1.24 | 1.31 | 1.37 | 1.43 | n/a | 5.5 | n/a | 5.5 | n/a | 5.5 |
| RDR | 1 | 0.82 | 0.72 | 0.66 | 0.62 | 0.59 | n/a | 0.51 | n/a | 0.45 | n/a | 0.43 |

It can be observed that, for a given shaper and charge gain $A_c$, the contribution $ENC_{s1}$ is defined once the value of $C_1$ is defined. The values of $A_c$ and $C_1$ also define, together, the maximum charge $Q_{max}$ that the linear front-end can process. If $V_{1max}$ is the maximum voltage swing at the output of the stage, it follows:

$$Q_{max} A_c = C_1 V_{1max} \text{ or } A_c = \frac{C_1 V_{1max}}{Q_{max}} \qquad (3)$$

We now express the dynamic range DR of the front-end as the ratio between the maximum charge $Q_{max}$ and the total ENC, which includes the $ENC_{ca}$ from the charge amplifier and the $ENC_{s1}$ from the first stage of the shaper:

$$DR = \frac{Q_{max}}{\sqrt{ENC_{ca}^2 + ENC_{s1}^2}} \qquad (4)$$

A design which aims at offering the highest possible resolution, i.e., lowest possible ENC tends to keep $ENC_{s1}$ negligible with respect to $ENC_{ca}$. Assuming about 10% (in power) it follows:

$$DR \approx \frac{Q_{max}}{\sqrt{1.1 \cdot ENC_{s1}^2}} = \frac{\frac{C_1 V_{max}}{A_c}}{\sqrt{1.1 \cdot \frac{a_p \eta_p}{A_c^2} 4kTC_1}} = \frac{V_{1max}}{\sqrt{1.1 \cdot a_p \eta_p \frac{4kT}{C_1}}} \qquad (5)$$

It is important to observe that $ENC_{ca}$ depends inherently on the total capacitance $C_{IN}$ at the input of the system in FIG. 1 and on the peaking time $\tau_p$. Here we assume that the charge amplifier has been already optimized for given $C_{IN}$ and $\tau_p$, and that the design of the shaper (with the 10% requirement) follows from that. Equation (5) shows that the dynamic range increases with $V_{1max}$ and with the square root of $C_1$. For a given shaper and capacitor value $C_1$ the dynamic is maximized if $V_{1max} = V_{dd}$, where $V_{dd}$ is the maximum voltage allowed by the technology, which means that the shaper amplifier must implement a rail-to-rail output stage. Further increases can only be achieved by increasing the value of $C_1$, which also means increasing $A_c$ as shown in Equation (3) and the area (and power) of the first stage of the shaper. For example, for a 0.13 μm technology with 1.2 V supply and typical Metal-Insulator-Metal (MIM) capacitance of 2 fF/μm², assuming a CU-3 shaper ($a_p \eta_p = 1.09$) with available area 30×30 μm, the dynamic range is limited, according to Equation (5), to DR<3,600.

For a given $C_1$, higher values of dynamic range can only be obtained at the expense of the ENC, and the maximum would be achieved when $ENC_{s1}$ dominates over $ENC_{ca}$. Equation (5) can be written in the more general form:

$$DR \approx \frac{V_{dd}}{\sqrt{\rho \cdot a_p \eta_p \frac{4kT}{C_1}}} \quad \rho = \frac{ENC^2}{ENC_{s1}^2} \qquad (6)$$

where $\rho > 1$ is the ratio between the squares of the total ENC and the $ENC_{s1}$ from the first stage of the shaper.

FIG. 3 shows an example of a compromise between ENC and Dynamic Range (DR) for the circuit in FIG. 2 and $ENC_{ca} = 200$ e⁻. Curve 310 shows how DR varies with charge gain $A_c$, and curve 320 shows how ENC varies with charge gain $A_c$. The four cases of ρ=1.1, 2, 11, and 30 are shown, and it can be observed how the dynamic range can be increased at the expense of the ENC. Values of ρ lower than 1.1 (i.e., ENC is dominated by $ENC_{s1}$) would not benefit the DR but would further limit the resolution by increasing the total ENC. The extreme case is for ρ=1 (i.e., no charge amplification) where DR≈15,000 and ENC≈900 e⁻. On the other hand, values of ρ higher than 11 (i.e., ENC is dominated by $ENC_{ca}$) would not benefit much the ENC but would further limit the DR.

It is worth emphasizing one more time that the $ENC_{ca}$ is assumed defined and optimized for noise (i.e. the charge amplifier is designed for given $C_{IN}$ and $\tau_p$) and that the design of the shaper follows from that. From Equation (6) it can also be observed that such defined DR does not depend on the peaking time $\tau_p$. However, once the system is designed with a given optimized $ENC_{ca}$ and a given $\rho$, an adjustment of the peaking time (obtained by scaling the value of the resistors) would in most cases change $ENC_{ca}$ and then would modify $\rho$ and DR, while the noise contribution from the shaper would not change.

So far we have assumed as negligible the noise contribution from subsequent stages, which provide the additional poles of the shaper. We first consider the case of real coincident poles. These configurations are frequently referred to as "CR-RC$^{n-1}$ shapers" since they can be realized using one CR filter followed by n−1 filters of RC type, and they are assumed to be connected at the voltage output of the charge amplifier. The resulting transfer function provides one zero in the origin, which compensates for the pole in the origin from the feedback capacitor of the charge amplifier, and n poles with time constant RC. The order of the shaping is equal to n with zeroes cancelled, and n poles in total. The lowest possible order without divergence of noise is n=2, which results in the well-known and widely adopted CR-RC shaper. The equations in the frequency (Laplace) and time domains are as follows:

$$H(s) = \frac{1}{(s+p)^n}, \quad h(t) = \frac{1}{(n-1)!} t^{n-1} \exp(-tp) \; n = 2, 3, 4, \ldots \quad (7)$$

where n is the order and p is the real pole, coincident.

FIG. 4 shows a frequently adopted configuration for CR-RC$^{n-1}$ shapers. Each additional i pole is obtained by adding one stage with components $C_i$, $R_i$, and $R_i/A_{vi}$, where $A_{vi}$ is the dc voltage gain. Assuming that the first filter stage (or first stage) 410 of a shaper 400 operates rail-to-rail, as required to minimize its and the following noise contributions, the performance of the shaper 400 is maximized when also the next stages also operate rail-to-rail. This condition is obtained with $A_{v2} \approx e$, $A_{v3} \approx e/2$, $A_{v4} \approx e/2.25$, $A_{v5} \approx e/2.36$, and so on. Next, the noise contribution of the two dissipative components of the second filter stage (or second stage) 420, i.e. $R_2$ and $R_2/A_{v2}$ is evaluated. When reported as equivalent parallel generators at the input of the first pole, the noise spectral densities are respectively given by:

$$S_{R2} = \frac{4kT}{R_2} \frac{R_2^2}{A_{v2}^2} \frac{1+\omega^2 R_1^2 C_1^2}{R_1^2} = \frac{4kT}{R_1} \frac{1}{A_{v2}^2} \frac{R_2}{R_1}(1+\omega^2 R_1^2 C_1^2) \quad (8a)$$

$$S_{R2/Av2} = 4kT \frac{R_2}{A_{v2}} \frac{1+\omega^2 R_1^2 C_1^2}{R_1^2} = \frac{4kT}{R_1} \frac{1}{A_{v2}} \frac{R_2}{R_1}(1+\omega^2 R_1^2 C_1^2) \quad (8b)$$

and they can be combined as a single noise generator:

$$S_2 = \frac{4kT}{R_1} \frac{C_1}{C_2} \frac{1}{A_{v2}}\left(1 + \frac{1}{A_{v2}}\right)(1+\omega^2 R_1^2 C_1^2) \quad (9)$$

where we used $R_1 C_1 = R_2 C_2$ for coincident poles. A contribution such as this can be reported as an equivalent parallel noise generator at the input of a charge amplifier 430 by scaling it with the square of the charge gain $A_c$. After a few transformations it follows the contribution to the ENC of the second stage 420, given by:

$$ENC_{s2}^2 = \frac{a_p \eta_p}{A_c^2} 4kTC_1 \frac{C_1}{C_2} \frac{1}{A_{v2}}\left(1 + \frac{1}{A_{v2}}\right)\left(1 + \frac{a_w}{\eta_p^2 a_p}\right) = ENC_{s1}^2 \frac{C_1}{C_2} \chi_2 \quad (10)$$

where $a_w$ is the ENC coefficient for white parallel noise and $\chi_2$ depends on the order of the shaper with $\chi_2 \approx 1$ for the second order, 0.83 for the third order, 0.78 for the fourth order, and so on. From Equation (10) it can be observed that the noise contribution from the second stage 420 of the shaper 400, relative to the first, decreases as the order increases and as the $C_2/C_1$ ratio increases, and in principle can be made negligible for $C_2 \gg C_1$, i.e. at expenses of area and power.

As the order increases, the noise contribution from the next stages must be added. Eventually, the total contribution from the shaper can be written as:

$$ENC_s^2 = ENC_{s1}^2\left(1 + \chi \frac{C_1}{C_s}\right) \quad (11)$$

where we assume rail-to-rail operation, $C_s$ is the average capacitance per pole, and $\chi \approx 1$ for the second order, 1.13 for the third order, 1.24 for the fourth order, 1.3 for the fifth order, and so on. It is worth emphasizing that the contribution of each additional stage can be made negligible by increasing its capacitance relative to $C_1$, which at equal gain (rail-to-rail operation) corresponds to a reduction in the value of the resistors.

Next consider the case of complex conjugate poles. These configurations, introduced by Ohkawa as described in A. Ohkawa, M. Yoshizawa, and K. Husimi, "Direct synthesis of the Gaussian filter for nuclear pulse amplifiers", Nucl. Instrum. & Meth., 138 (1979) 85-92, which is incorporated by reference in its entirety as if fully set forth in this specification, have the advantage of a faster return to zero at equal peaking time with respect to the real poles of the same order. The transfer functions in the frequency (Laplace) domain are:

$$H(s) = \frac{1}{(s+p_1)\prod_{i=2}^{(n+1)/2}[(s+r_i)^2 + i_i^2]} \quad (12)$$

$n = 3, 5, 7, \ldots$ $$H(s) = \frac{1}{\prod_{i=1}^{n/2}[(s+r_1)^2 + i_i^2]}$$

$n = 2, 4, 6, \ldots$ where n is the order, $p_1$ is the real pole, and $r_j$, $i_j$ are the real and imaginary parts of the complex-conjugate poles, obtained as roots of the equation $$\frac{1}{0!} - \frac{s^2}{1!} + \frac{s^4}{2!} - \frac{s^6}{3!} + \ldots \frac{s^{2n}}{n!} = 0,$$

while in the time domain the transfer functions are:

$$s(t) = K_1 \exp(-tp_1) + \sum_{i=2}^{(n+1)/2} 2|K_i|\exp(-tr_i)\cos(-ti_i + \angle K_i) \quad (13)$$

$$n = 3, 5, 7, \ldots$$

$$s(t) = \sum_{i=1}^{n/2} 2|K_i|\exp(-tr_i)\cos(-ti_i + \angle K_i)$$

$$n = 2, 4, 6, \ldots$$

where the coefficients $K_i$ (with magnitude $|K_i|$ and argument $\angle K_i$) are given by:

$$K_i = \frac{1}{[-r_i - ji_i + p_1]\prod_{k=2,k\neq i}^{(n+1)/2}[-r_i - ji_i + r_k^2 + i_k^2] - 2ji_i} \, i > 1, \quad (14)$$

$$n = 3, 5, 7, \ldots$$

$$K_i = \frac{1}{\prod_{k=1,k\neq i}^{n/2}[-r_i - ji_i + r_k^2 + i_k^2] - 2ji_i}$$

$$n = 2, 4, 6, \ldots$$

FIG. 5 shows a frequently adopted configuration for these shapers, which includes a charge amplifier 510, a first filter stage 520 and second filter stage 530 of a shaper 500. If n is the order (odd in these cases), the real pole is given by the first filter stage and the complex conjugate poles are given by the (n−1)/2 additional filter stages. Each additional filter stage has a transfer function:

$$H(s) = -\frac{A_{vi}}{s^2 R_i C_i R_{ia} C_{ia} + sC_i[R_i + R_{ia}(1 + A_{vi})] + 1} = \frac{A_{vi}}{\frac{s^2}{\omega_i^2} + \frac{s}{\omega_i Q_i} + 1} \quad (15)$$

where the values of $\omega_0 = 1/\tau_0$ (real pole), $\omega_i$ and $Q_i$, normalized to the peaking time $\tau_p$, can be obtained from Table II, which includes design coefficients for unipolar shapers with complex-conjugate poles in different orders. The value of $C_{ia}$ is about 20% of the value of $C_i$, and we can thus assume an average capacitance per pole $C_s \approx (C_i + C_{ia})/2$.

Evaluating the noise contribution of the dissipative components of these stages is cumbersome. Eventually, the total contribution from the shaper 500 can be written again as in Equation (11), where we assume again rail-to-rail operation, $C_s$ is the average capacitance per pole, and $\chi \approx 5.5$ for all orders. In these configurations most of the noise contribution comes from the series resistors $R_{ia}$. Once again it is worth emphasizing that, apart from the first stage 520, the contribution can be made negligible by increasing the value of the average capacitance per pole $C_s$. Table I includes the value of $\chi$ for various orders.

TABLE II

|      | $\omega_0\tau_p$ | $\omega_1\tau_p$ | $Q_1$ | $\omega_2\tau_p$ | $Q_2$ | $\omega_3\tau_p$ | $Q_3$ |
|------|------|------|------|------|------|------|------|
| CU-2 | —    | 1.031 | 0.541 | —    | —    | —    | —    |
| CU-3 | 1.793 | 1.976 | 0.606 | —    | —    | —    | —    |
| CU-4 | —    | 2.471 | 0.514 | 2.812 | 0.672 | —    | —    |
| CU-5 | 2.945 | 3.066 | 0.543 | 3.532 | 0.736 | —    | —    |
| CU-6 | —    | 3.400 | 0.507 | 3.612 | 0.576 | 4.178 | 0.797 |
| CU-7 | 3.758 | 3.842 | 0.523 | 4.128 | 0.61 | 4.775 | 0.855 |

Also included in Table I is the relative dynamic range RDR, i.e. the DR normalized to the one for the RU-2 case, assuming the same values for $ENC_{ca}$ and $\rho$ (e.g. $\rho=11$ which is the practical case where $ENC_s = ENC_{ca}/10$), and all shapers using the same value of $C_1$ and $C_s = C_1$. From Table I it may appear that low order shapers offer a higher DR. A thorough comparative analysis, though, should include the impact of the shaper on $ENC_{ca}$. For example, under constraint of finite pulse width (e.g. rate constraint) and white dominant series noise, higher order shapers offer a lower $ENC_{ca}$ due to the higher symmetry (i.e. longer peaking time at equal width).

Applying these results to Equations (5) and (6) for the dynamic range, we obtain:

$$DR \approx \frac{Q_{max}}{\sqrt{\rho \cdot ENC_s^2}} = \frac{V_{1max}}{\sqrt{\rho \cdot a_p \eta_p 4kT\left(\frac{1}{C_1} + \frac{\chi}{C_s}\right)}} \quad (16)$$

$$\rho = \frac{ENC^2}{ENC_s^2}$$

For a given total capacitance $C_T = C_1 + (n-1)C_s$, where n is the order of the shaper, the DR in (16) has a maximum around:

$$C_1 = \frac{C_T}{1 + \sqrt{\chi(n-1)}} \quad (17)$$

$n$ = shaper order which for all of the low order shapers and high order shapers with complex conjugate poles is around $C_T/n$ while for high order shapers with real coincident poles is somewhat lower. The rest of the capacitance can be distributed in equal amount among the additional poles, but it should be observed that slightly better results can be obtained by assigning larger capacitance values to the last stage. Since the maximum is relatively shallow, the value of DR obtained for $C_T/n$ is still a good approximation.

In the previously reported example with $C_s = C_1 = 1.8$ pF, $ENC_{ca} = 200$ e⁻, and $\rho=11$, it follows DR<1,400 and 2,800 for CU-3 and RU-2, respectively. With the described configurations and assuming comparable area and power, the shapers with real poles offer a dynamic range of about 70% higher than the ones with complex conjugate poles.

FIGS. 6(a)-(d) illustrate some configurations of classical shapers which could provide an alternative solution to the voltage feedback circuit in FIG. 2 for realizing a low-noise single pole stage. They make use of CMOS current mirrors to scale down the current in resistor R, thus reducing its noise contribution. In fact, if $\lambda = \lambda_1 \lambda_2$ is the scaling factor, the dissipative current feedback $I_F$ through $M_F$ can be approximated as $I_F \approx V_o/R_{eq}$, where $R_{eq} = R \cdot \lambda$, is the equivalent resistance, which sets with C the time constant of the filter, given by $C \cdot R_{eq}$. The parallel noise contribution from R, reported at the input, scales down with $\lambda^2$, being given by $4kT/(R \cdot \lambda^2)$, i.e. $4kT/(R_{eq} \cdot \lambda)$. It results that, at equal C and time constant, the noise contribution from R is a factor $\lambda$ lower than the one from $R_1$ in the corresponding configuration of FIG. 2.

On the other hand, design constraints for linearity and dynamic range suggest that the dominant noise contribution comes from the channel noise of the last transistor of the feedback chain, $M_F$.

We start analyzing the configuration in FIG. 6(a). This configuration can also make use of a cascode stage $M_C$, as shown in the detail in FIG. 6(a), which is frequently used in complementary configurations as described in R. L. Chase, A. Hrisoho, and J. P. Richer, "8-channel CMOS preamplifier and shaper with adjustable peaking time and automatic pole-zero cancellation", Nucl. Instrum. & Meth., A409 (1998) 328-331, and C. Fiorini and M. Porro, "Integrated RC cell for time-invariant shaping amplifiers", IEEE Trans. Nucl. Sci., vol. 51, no. 5, pp. 1953-1960, 2004, each of which is incorporated by reference in its entirety as if fully set forth in this specification. It can be easily verified that, in order to guarantee a linear response, the relationship $R \cdot g_{mR} \gg 1$ must be satisfied, where $g_m$ is the transconductance of $M_R$ (or the one of a cascode MOSFET, if applicable). This relationship imposes a limit to the minimum current $I_R$ flowing through R. Assuming that $M_R$ operates in moderate inversion (as required to mirrors to guarantee a large enough voltage swing), its $g_m$ can be approximated as $g_{mR} \approx I_R/nV_T$, where n is the sub-threshold factor (n≈1.2 typical) and $V_T = kT/q$ is the thermal voltage (~25 mV at 300 K). It follows the requirement on the voltage drop across R, given by $R \cdot I_R \gg nV_T$. Since $M_F$ operates in moderate inversion, its white noise spectral density is given by $S_{nMF} = 2qI_F$. By considering the mirror ratio and by imposing the relationship for linear response it follows:

$$S_{nMF} = 2qI_F = \frac{2qI_R}{\lambda} \gg \frac{2qnV_T}{R\lambda} = \frac{2kT}{R_{eq}} \quad (18)$$

which shows that, at equal C and time constant (i.e., when $R_{eq} = R_1$), the noise spectral density from $M_F$ would be larger than the one from $R_1$ in FIG. 2, given by $4kT/R_1$. The low-frequency noise component from $M_F$ should also be added, but this contribution can be reduced, to some extent, by increasing the gate area of $M_F$ (i.e., by increasing both L and W of $M_F$). The non-stationary noise contribution can be considered, which is due to the increase in the drain current of $M_F$ in presence of a signal. In the time domain this contribution, integrated in C, can be approximated as $qi_F\tau_p/C^2$ where $i_F$ is the signal current and $\tau_p$ is the peaking time, which is a measure of the integration time. Additionally, the signal integrated in C is given by $QA_c/C$, where Q is the input charge and $A_c$ is the charge amplifier charge gain. By considering that $i_F\tau_p \approx QA_c$ it follows for the signal-to-noise ratio due to the non-stationary contribution:

$$\left(\frac{S}{N}\right)_{ns} \approx \frac{QA_c}{C}\sqrt{\frac{C^2}{qQA_c}} = \sqrt{\frac{Q}{q}A_c} = \sqrt{NA_c} \quad (19)$$

where N is the number of signal electrons at the input of the charge amplifier. In most practical cases this contributions has negligible impact on the total S/N due to $A_c \gg 1$, as it can be observed assuming a minimum signal N≈ENC, which means ENC is the number of electrons. Attempts to improve the linearity by controlling the gate voltage of the cascode $M_C$ can be considered, as shown in FIG. 6(b) and in I. I. Jung, J. H. Lee, C. S. Lee, and Y. W. Choi, "Design of high-linear CMOS circuit using a constant transconductance method for gamma-ray spectroscopy system", Nucl. Instrum. & Meth., A629 (2011) 277-281, which is incorporated by reference in its entirety as if fully set forth in this specification. However, the noise contribution from the controlling stages must be taken into account; also, maintaining the voltage drop across R below the thermal voltage $V_T$ might be challenging.

Most of the previous arguments apply to the configuration in FIG. 6(c) as described in G. Bertuccio, P. Gallina, and M. Sampietro, "'R-Lens filter': an (RC)n current-mode low-pass filter", IEEE Electronics Letters, vol. 35, no. 15, pp. 1209-1210, 1999, which is incorporated by reference in its entirety as if fully set forth in this specification, where the $M_R$ is now the MOSFET used as source follower.

With regards to the configuration in FIG. 6(d), ideally the voltage drop across $R_1$ can be kept small, but, in practical cases, it is difficult to reduce it to values much lower than the thermal voltage $V_T$, and Equation (18) would still apply. A further challenge towards the various configurations in FIGS. 6(a)-(d) is to obtain a high linearity in the mirror stages over a wide dynamic range of currents.

The discussions above suggest that the linear configurations that make use of active devices in the signal path (e.g., current mirrors) cannot offer a dynamic range wider than the corresponding based on passive components only. It should be observed that OTA-based CMOS stages would enter this category as well, as described in T. Noulis, C. Deradonis, S. Siskos, and G. Sarrabayrouse, Nucl. Instrum. & Meth., A583 (2007) 469-478., which is incorporated by reference in its entirety as if fully set forth in this specification. The use of BiCMOS technologies would greatly alleviate the limitation in linearity, as shown in S. Buzzetti and C. Guazzoni, "A novel compact topology for high-resolution CMOS/BiCMOS spectroscopy amplifiers", IEEE Trans. Nucl. Sci., vol. 52, no. 5, pp. 1611-1616, 2005, which is incorporated by reference in its entirety as if fully set forth in this specification, but some of the limitations previously discussed still apply, including the loss due to the voltage drops.

Therefore, there is a need for a low-noise analog shaper that provides high dynamic range.

SUMMARY

An analog filter is disclosed. A preferred embodiment of the analog filter includes a chain of filter stages, and each filter stage has an input node and an output node. The output node of a filter stage in the chain of filter stages is connected to the input node of an immediately succeeding filter stage through a resistor. Each filter stage includes an amplifier and a capacitor.

The analog filter includes a first feedback resistor for providing a negative feedback. The first feedback resistor has a first end and a second end. The first end is connected to the output node of the last filter stage along the chain of filter stages, and the second end is connected to the input node of a first preceding filter stage.

The analog filter also includes a feedback capacitor for providing a positive feedback. The feedback capacitor has a first end and a second end. The first end is connected to the output node of one of the chain of filter stages, and the second end is connected to the input node of a second preceding filter stage.

The analog filter may further include a second feedback resistor for providing a negative feedback. The second feedback resistor has a first end and a second end. The first end of the second feedback resistor is connected to the output node of the filter stage immediately preceding the last filter stage, and the second end of the second feedback resistor is connected to the input node of a third preceding filter stage.

In an alternative embodiment, the input node of the first filter stage in the chain of filter stages may be coupled to a current source. In an alternative embodiment, the output at the output node of the last filter stage may be voltage.

A method for filtration of a signal is also disclosed. In a preferred embodiment of the method for filtration of a signal, the method includes filtering the signal through a chain of filter stages, each filter stage has an input node and an output node, and the output node of a filter stage in the chain of filter stages is connected to the input node of an immediately succeeding filter stage through a resistor; feeding the signal at the output node of the last filter stage along the chain of filter stages to the input node of a first preceding filter stage through a first negative feedback loop; and feeding the signal at the output node of one of the chain of filter stages to the input node of a second preceding filter stage through a positive feedback loop.

In an alternative embodiment, the feeding the signal at the output node of the last filter stage along the chain of filter stages to the input node of a first preceding filter stage through a first negative feedback loop includes feeding the signal at the output node of the last filter stage along the chain of filter stages to the input node of the first preceding filter stage through a resistor.

In an alternative embodiment, the method may further include the feeding the signal at the output node of the filter stage immediately preceding the last filter stage to the input node of a third preceding filter stage through a second negative feedback loop. In an alternative embodiment, the feeding the signal at the output node of the filter stage immediately preceding the last filter stage to the input node of a third preceding filter stage through a second negative feedback loop includes feeding the signal at the output node of the filter stage immediately preceding the last filter stage to the input node of the third preceding filter stage through a resistor.

In an alternative embodiment, the feeding the signal at the output node of one of the chain of filter stages to the input node of a second preceding filter stage through a positive feedback loop includes feeding the signal at the output node of the one of the chain of filter stages to the input node of the second preceding filter stage through a capacitor.

In an alternative embodiment, the feeding the signal at the output node of one of the chain of filter stages to the input node of a second preceding filter stage through a positive feedback loop includes feeding the signal at the output node of the last filter stage along the chain of filter stages to the input node of the filter stage immediately preceding the last filter stage through a capacitor.

BRIEF DESCRIPTION OF THE DRAWINGS

For a more complete understanding of the present invention, and for further advantages thereof, reference is now made to the following description taken in conjunction with the accompanying drawings in which.

DETAILED DESCRIPTION

The following discussion is presented to enable a person skilled in the art to make and use the invention. Various modifications will be readily apparent to those skilled in the art, and the general principles described herein may be applied to embodiments and applications other than those detailed below without departing from the spirit and scope of the present invention as defined herein. The present disclosure is not intended to be limited to the embodiments shown, but is to be accorded the widest scope consistent with the principles and features disclosed.

The present disclosure provides a method and apparatus for designing low-noise analog shapers. The shaper according to preferred embodiments of the present invention is capable of reducing noises and providing high dynamic range. Some basic blocks in the disclosed embodiments may also be used as part of time-variant filters.

The discussion above on the design of low-noise linear shapers suggests that, once the Equivalent Noise Charge (ENC) from a charge amplifier is defined, the dynamic range of the system is set by the voltage swing and the value of the capacitance realizing the poles of a shaper following the charge amplifier. The configuration used to realize the pole(s) has also relevant impact. Those configurations based on passive components in feedback offer a better dynamic range than the ones using both active and passive components, like scaling mirrors. The disclosed embodiments introduce the concept of Delayed Dissipative Feedback (DDF), and apply the DDF to voltage-based configurations. The delayed dissipative feedback can overcome some of the limitations of the more classical configurations discussed above.

A most frequently adopted shape is the semi-Gaussian, available in different orders (i.e. number of poles). Semi-Gaussian shapers are relatively easy to implement and can offer a signal-to-noise ratio within a few percent from the usually impractical optimal shapers. For example, for white series and white parallel noise contributions, the minimum ENC for a high order semi-Gaussian shape is about 12.5% higher than the one for the optimum shape (i.e., infinite cusp).

Figure 7:
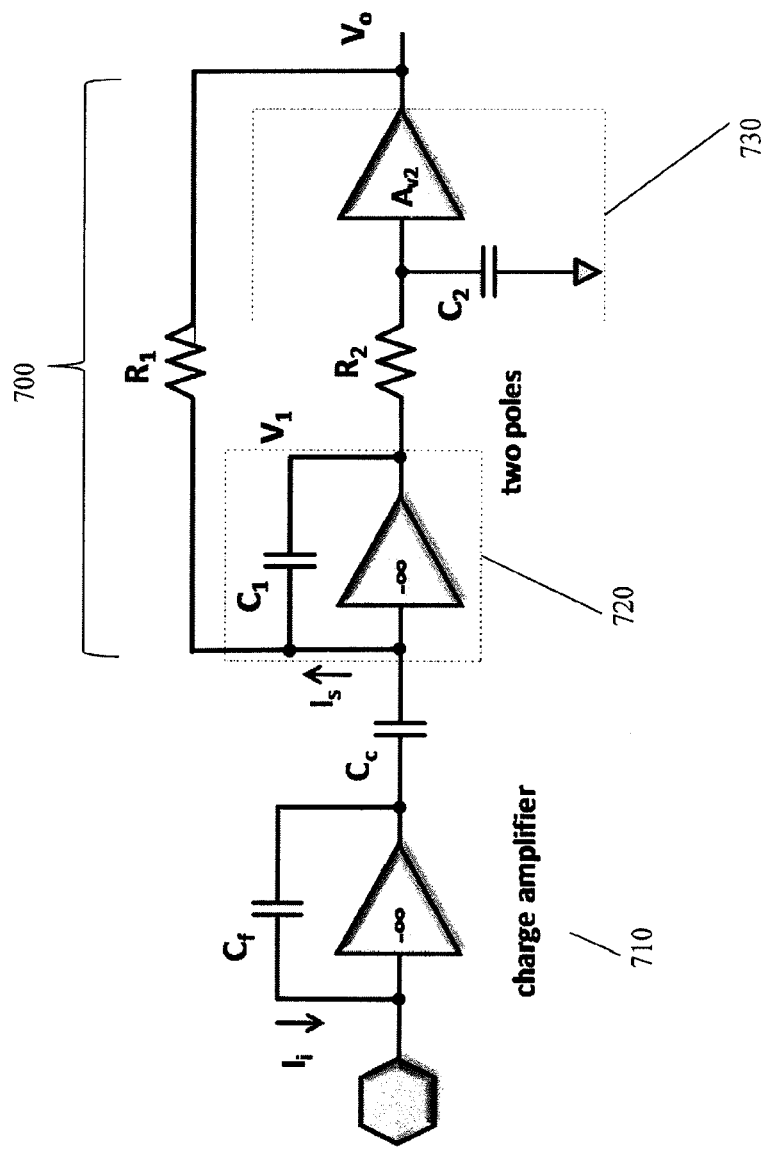
FIG. 7 is a schematic diagram illustrating delayed feedback applied to a second order shaper according to one embodiment of the present invention.

One embodiment of applying the DDF is to delay wherever possible the feedback of the resistive (or dissipative) components. An example of applying the DDF to a second order filter is shown in FIG. 7. FIG. 7 includes a charge amplifier 710, followed by a shaper 700 including a first filter stage 720 and a second filter stage 730.

In the configuration of FIG. 7, the resistive (or dissipative) feedback to the input of the shaper 700 is provided through $R_1$ from the output $V_o$, delayed by the time constant $R_2C_2$, rather than from $V_1$. As in previous cases, the minimization of the noise contributions is achieved when both $V_1$ and $V_o$ operate rail-to-rail at the maximum input charge, which requires a defined value for $A_{v2}$. Note that $A_{v2}$ must be negative in order for the feedback through $R_1$ to be negative. The input stage of the amplifier $A_{v2}$ is not a virtual ground, but does not need to be rail-to-tail. The transfer function $V_o/V_1$ can be alternatively realized using an active filter, with minor impact on the noise performance.

The transfer function can be easily calculated as:

$$\frac{V_o}{I_s} = \frac{R_1}{s^2 \frac{R_1 C_1 R_2 C_2}{A_{v2}} + s \frac{R_1 C_1}{A_{v2}} + 1} \quad (20)$$

Figure 1:
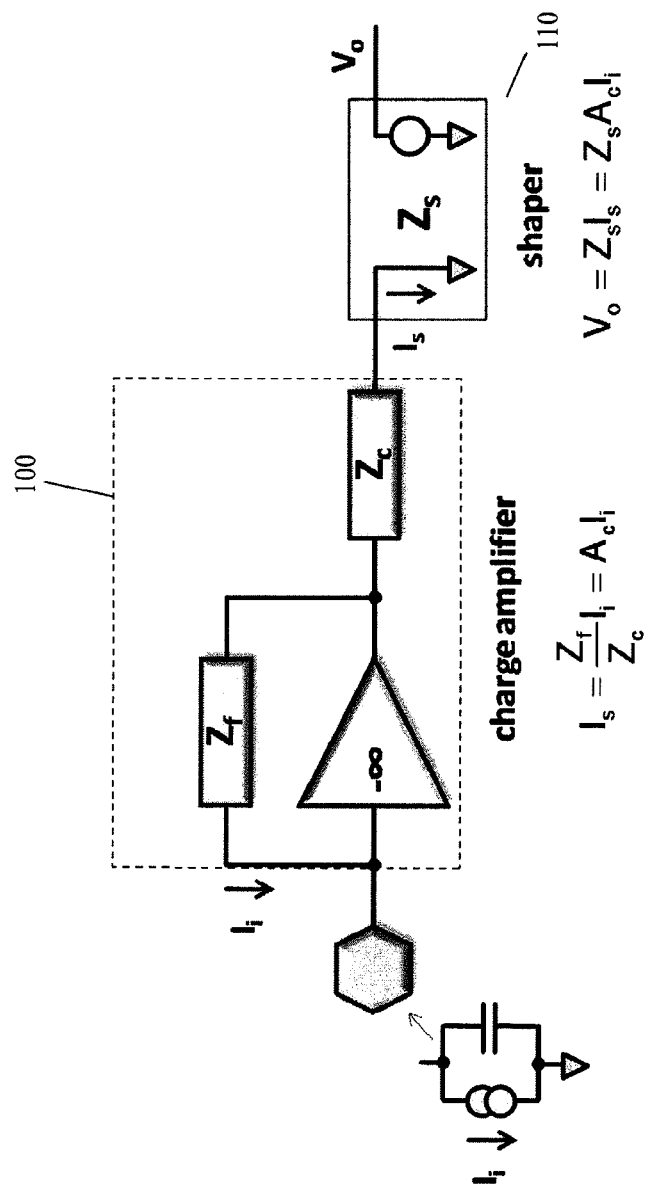
FIG. 1 is a schematic diagram illustrating a charge amplifier followed by a shaper.
Figure 2:
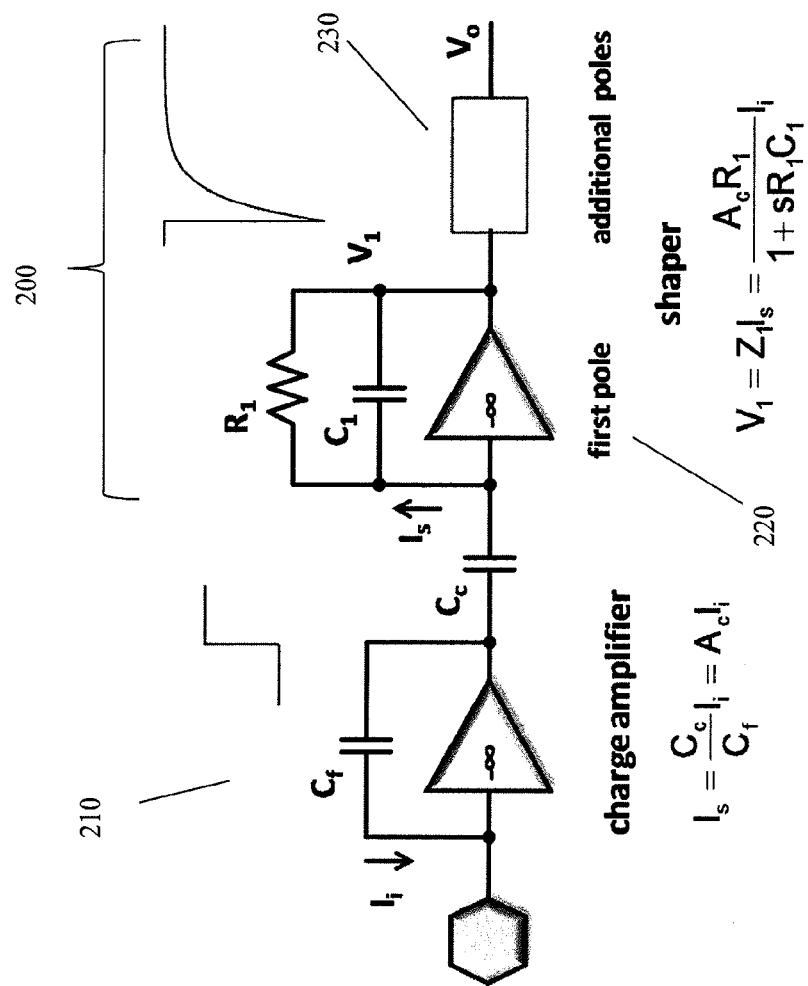
FIG. 2 is a schematic diagram illustrating a charge amplifier with a capacitive feedback for the charge amplifier and a single-pole transimpedance amplifier as input stage of a shaper.
Figure 3:
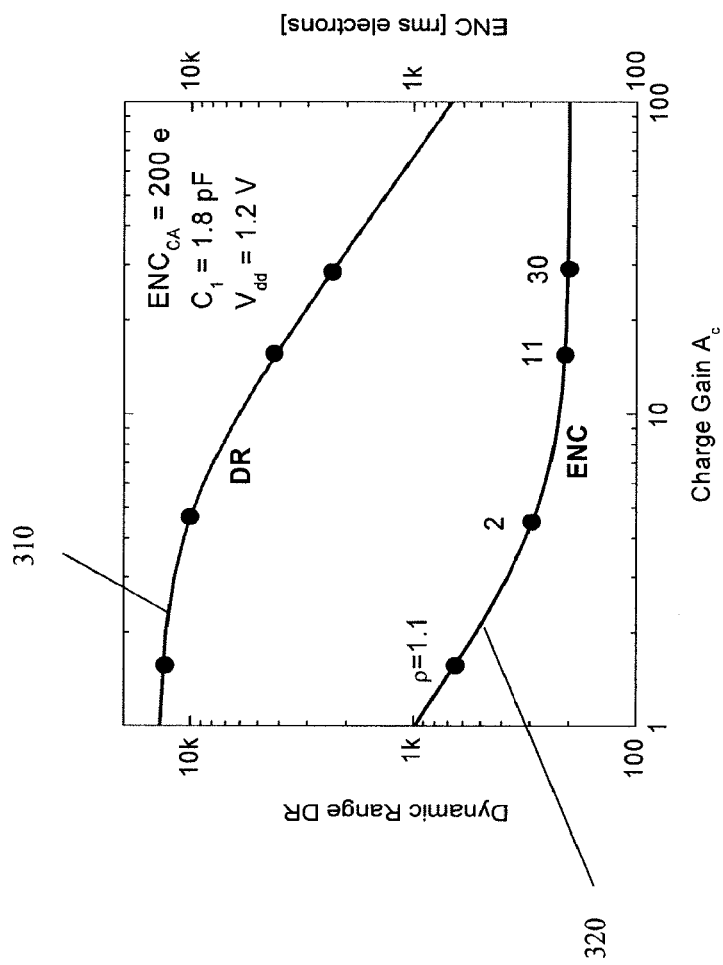
FIG. 3 is a graph showing an example of dynamic range and equivalent noise charge vs. charge gain Ac, including four cases of $\rho=1.1, 2, 11,$ and 30.
Figure 4:
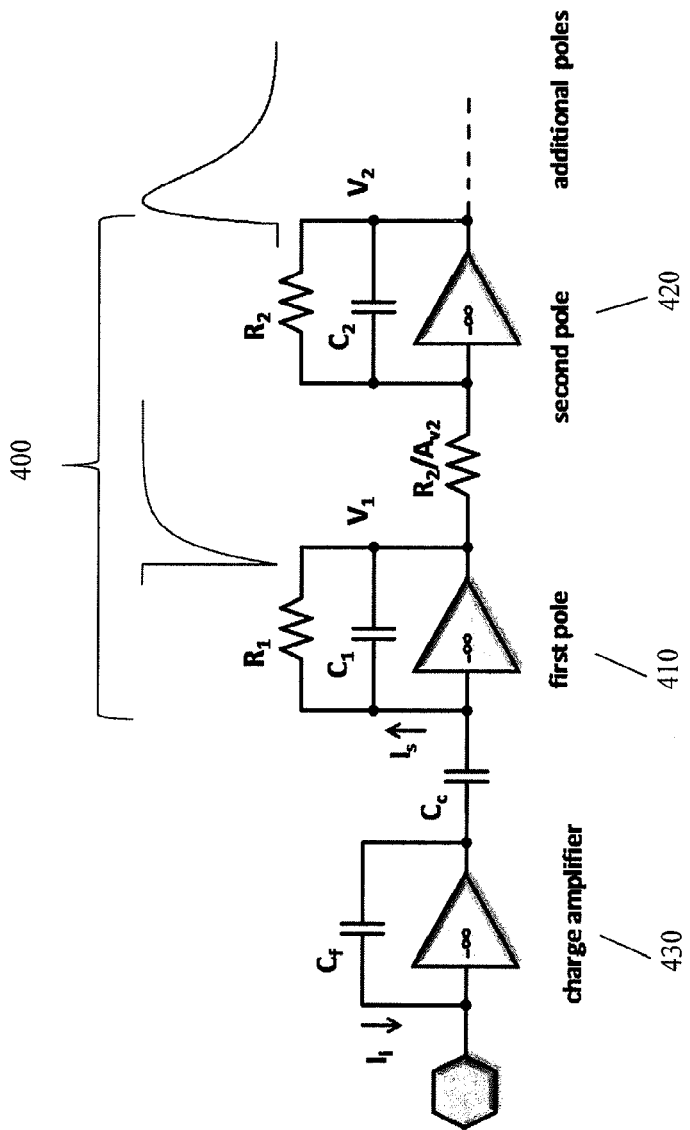
FIG. 4 is a schematic diagram illustrating a charge amplifier followed by a shaper with real coincident poles.

It can be easily verified that two real and coincident poles with time constant $\tau_o$ are obtained if $R_1C_1=2\tau_o A_{v2}$ and $R_2C_2=\tau_o/2$. If the first stage 720 operates rail-to-rail, as required to minimize its and the following noise contributions, the performance of the shaper 700 is maximized when also the next stages operate rail-to-rail, which is obtained for $\eta_p=\tau_o/R_1C_1=1/e$ (i.e., the ratio between the peaking time and $R_1C_1$ is a factor ~2.718, which is lower than that in the case in FIG. 3). The noise contribution of the two dissipative components, $R_1$ and $R_2$ can now be calculated. Concerning $R_1$, the result in Equation (2) still applies, where $a_p=0.92$, which is obtained from table I. Eventually the contribution from $R_2$ can be either calculated or simulated. The total contribution from the shaper 700 can be written as in Equation (11) with $\chi \approx 1.35$ and the dynamic range as in Equation (16) with a maximum again, for $C_2 \approx C_1$. When compared to the same order configuration in FIG. 4, the noise power of this configuration at equal total capacitance is less than a half, which is a ~0.44 factor, and the dynamic range is about 50% higher, which is a ~1.52 factor.

The configuration in FIG. 7 can also be used to realize a second order shaper with two complex conjugate poles. This is obtained for $R_1C_1=A_{v2}/(\omega_1 Q_1)$ and $R_2C_2=Q_1/\omega_1$ where the values of $\omega_1$ and $Q_1$ are obtained from Table II. For this configuration the values of $\eta_p$ and $\chi$ are 0.4 and 1.38, respectively. The noise power at equal capacitance and the dynamic range are comparable to the ones for the previous case of real poles, with the advantage of a slightly faster return to baseline at equal peaking time.

Figure 8:
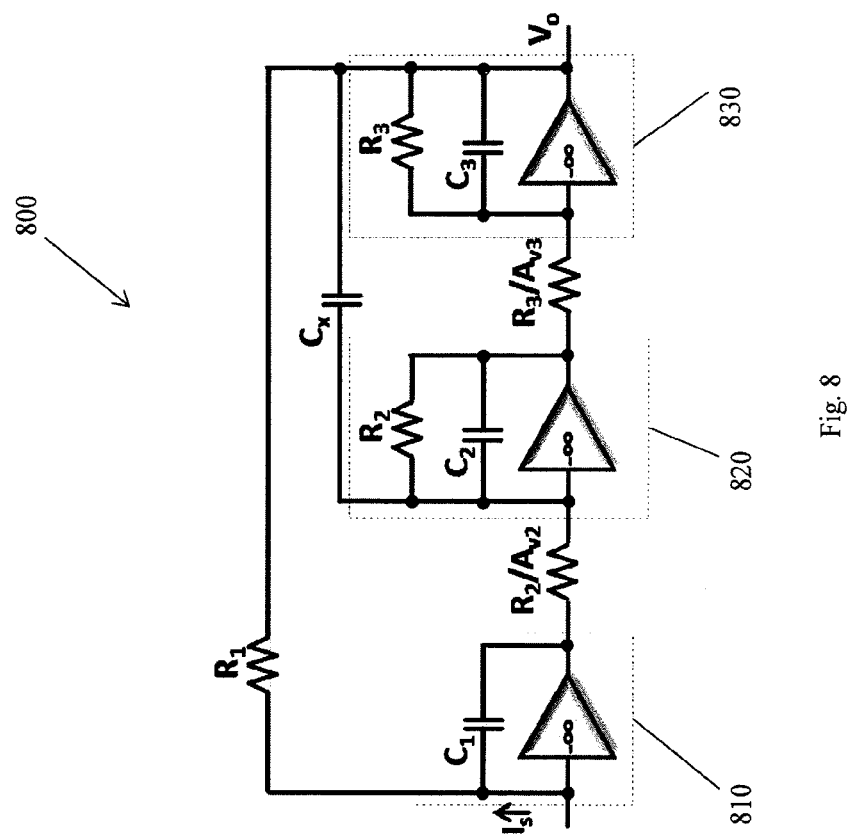
FIG. 8 is a schematic diagram illustrating delayed feedback applied to a third order shaper according to one embodiment of the present invention.

The delayed dissipative feedback can be used for higher order configurations. FIG. 8 shows an example of a third order realization of a shaper 800, which includes a first filter stage 810, a second filter stage 820 and a third filter stage 830. The output of the third filter stage 830, i.e., the last filter stage in the shaper 800, is connected to the input of the first filter stage 810 through a resistor $R_1$ to provide a negative feedback. The output of the last filter stage 830 is also connected to the input of the second stage 820 through a capacitor $C_x$ to provide a positive feedback.

The shaper 800 has a transfer function of:

$$\frac{V_o}{I_s} = \frac{R_1}{s^3 \frac{\tau_1 \tau_2 \tau_3}{A_{v2}A_{v3}} + s^2 \frac{\tau_1[\tau_2(1-\alpha_x)+\tau_3]}{A_{v2}A_{v3}} + s \frac{\tau_1}{A_{v2}A_{v3}} + 1} \quad (21)$$

where $\tau_1=R_1C_1$, $\tau_2=R_2C_2$, $\tau_3=R_3C_3$, and $\alpha_x=A_{v3}\tau_{2x}/\tau_2$ (here $\tau_{2x}=R_2C_x$). It is important to observe that without capacitance $C_x$, it would not be possible to obtain a semi-Gaussian shaper, either with real coincident or with complex conjugate poles as in Table II. In the case of real coincident poles with time constant $\tau_o$, it follows:

$$\frac{\tau_1 \tau_2 \tau_3}{A_{v2}A_{v3}} = \tau_o^3, \quad (22)$$

$$\frac{\tau_1[\tau_2(1-\alpha_x)+\tau_3]}{A_{v2}A_{v3}} = 3\tau_o^2,$$

$$\frac{\tau_1}{A_{v2}A_{v3}} = 3\tau_o$$

which, once solved, yields:

$$A_{v2} = \frac{\tau_1}{3\tau_o A_{v3}}, \quad (23)$$

$$\tau_2 = \frac{1}{2} \frac{\tau_o}{1-\alpha_x}\left(1 \pm \sqrt{1-\frac{4}{3}(1-\alpha_x)}\right),$$

$$\tau_3 = \frac{\tau_o^2}{3\tau_2}$$

The values $\eta_p=0.52$ and $A_{v3}=1.08$ must be chosen in order to have all stages operating at equal voltage range (i.e., rail-to-rail), which also corresponds to the minimum noise at equal gain. The condition $\alpha_x \geq 0.25$ must be satisfied, where $\alpha_x=0.25$ offers the minimum noise. The consequent value of $\chi$ to be used in Equation (11) is 3.6. When compared to the same order configuration in FIG. 4, the noise power at equal total capacitance is a factor 0.58 lower and the dynamic range is about 31% higher.

The configuration in FIG. 8 may also be used to realize a third order shaper with complex conjugate poles, imposing:

$$\frac{\tau_1\tau_2\tau_3}{A_{v2}A_{v3}} = \frac{1}{\omega_0\omega_1^2}, \quad (24)$$

$$\frac{\tau_1[\tau_2(1-\alpha_x)+\tau_3]}{A_{v2}A_{v3}} = \frac{1}{\omega_0\omega_1 Q_1} + \frac{1}{\omega_1^2},$$

$$\frac{\tau_1}{A_{v2}A_{v3}} = \frac{1}{\omega_0} + \frac{1}{\omega_1 Q_1}$$

The values $\eta_p$=0.57 and $A_{v3}$=1.08 must be chosen in order to have all stages operating at equal voltage range (i.e. rail-to-rail), which also corresponds to the minimum noise at equal gain. The condition $\alpha_x \geq 0.35$ must be satisfied, where $\alpha_x$=0.35 offers the minimum noise. The consequent value of $\chi$ to be used in Equation (11) is 4.32. When compared to the same order configuration in FIG. 5, the noise power at equal total capacitance is a factor 0.26 lower and the dynamic range is about 95% higher.

Figure 9A:
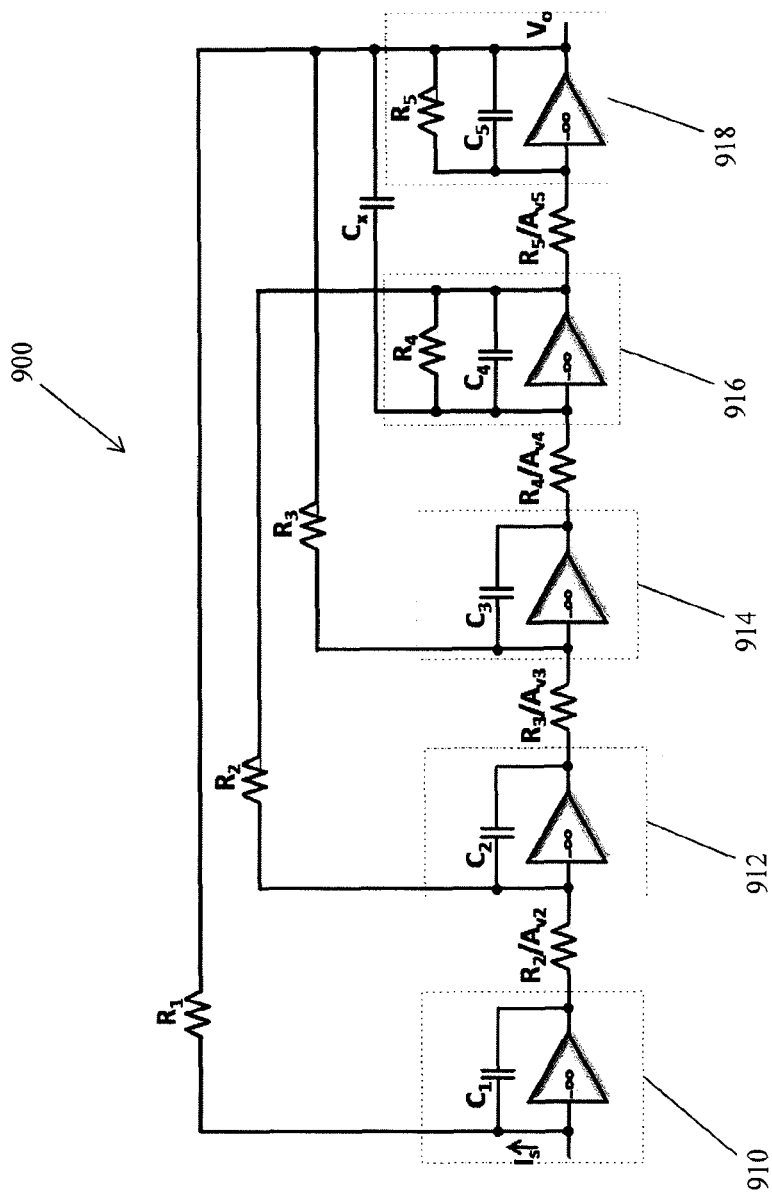
FIG. 9(a) is a schematic diagram illustrating delayed feedback applied to a fifth order shaper according to one embodiment of the present invention.

The delayed dissipative feedback may be used in various configurations. FIG. 9(a) shows an example of a delayed dissipative feedback applied to a fifth order shaper 900, where a small capacitance $C_x$ in positive feedback, needed to obtain a semi-Gaussian shape, is applied from the output of the last stage, i.e., the fifth stage 918, to the input of the stage immediately preceding the last stage, i.e., the fourth stage 916. Negative feedback is provided from the output of the last stage 918 to the input of the first stage 910 and the third stage 914 through resistor $R_1$ and $R_3$, respectively. Negative feedback is also provided from the output of the fourth stage 916 to the input of the second stage 912 through resistor $R_2$.

The configuration in FIG. 9(a) can be used for real or complex conjugate poles. Table III summarizes the coefficients and performance achievable using the delayed dissipative feedback. The $RDR_{DDF}$ is always relative to the RU-2 case in Table I.

TABLE III

|  | RU-2$^{df}$ | RU-3$^{df}$ | RU-5$^{df}$ | CU-2$^{df}$ | CU-3$^{df}$ | CU-5$^{df}$ |
|---|---|---|---|---|---|---|
| $\eta_p$ | 0.368 | 0.52 | 0.67 | 0.4 | 0.57 | 0.81 |
| $\chi$ | 1.35 | 3.6 | 11.7 | 1.38 | 4.32 | 13.8 |
| $RDR_{DDF}$ | 1.52 | 1.08 | 0.66 | 1.48 | 1 | 0.58 |
| $RDR_{DDF}$/RDR | 1.52 | 1.32 | 1 | — | 1.96 | 1.3 |

A comparison between Table I and Table III shows that the DDF is particularly beneficial with low and medium order shapers. This is also highlighted observing the ratio $RDR_{DDF}$/RDR in Table III. A very promising configuration seems to be CU-3$^{df}$ where a factor of two (2) higher dynamic range can be achieved with respect to the classical configuration. With high order cases the impact is small or negligible due to the noise contribution from the additional poles, which can be seen by the increase in coefficient $\chi$. However, the use of larger values for $R_1$ reduces in all cases the value of the current required to generate the rail-to-rail voltage drop, thus reducing its noise contribution.

Figure 9B:
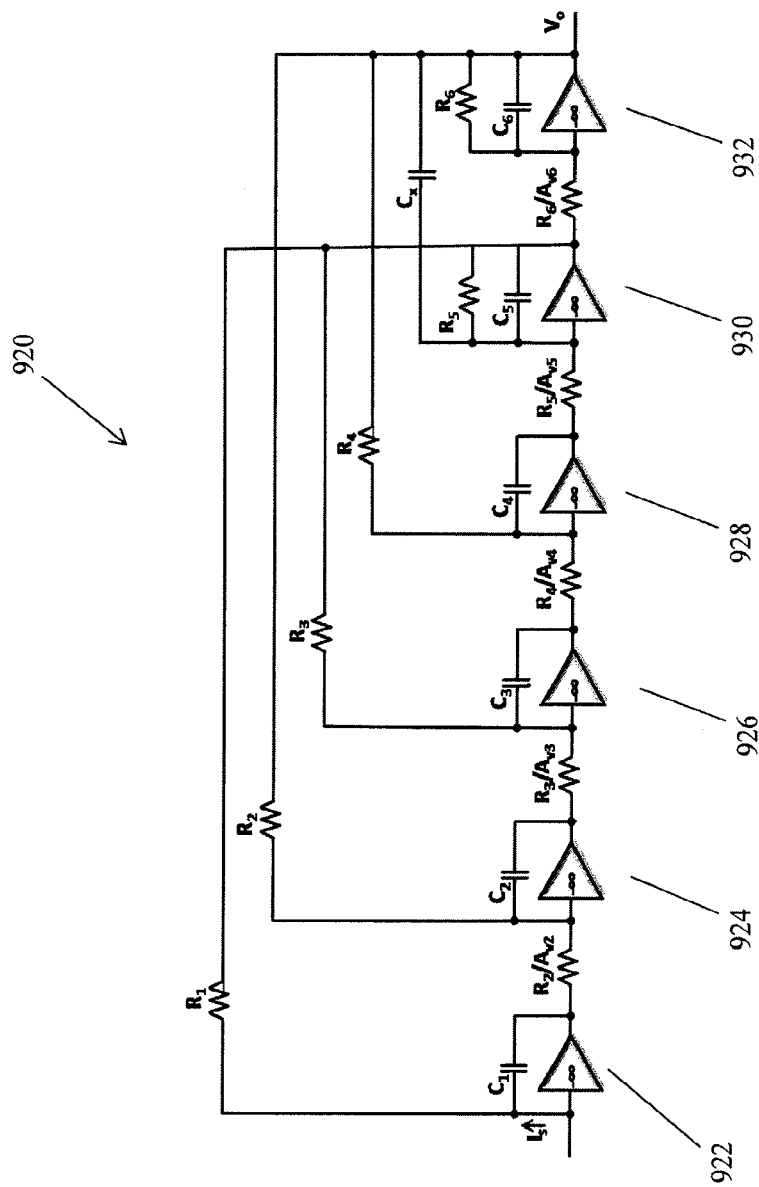
FIG. 9(b) is a schematic diagram illustrating a shaper of sixth order according to one embodiment of the present invention.
Figure 9C:
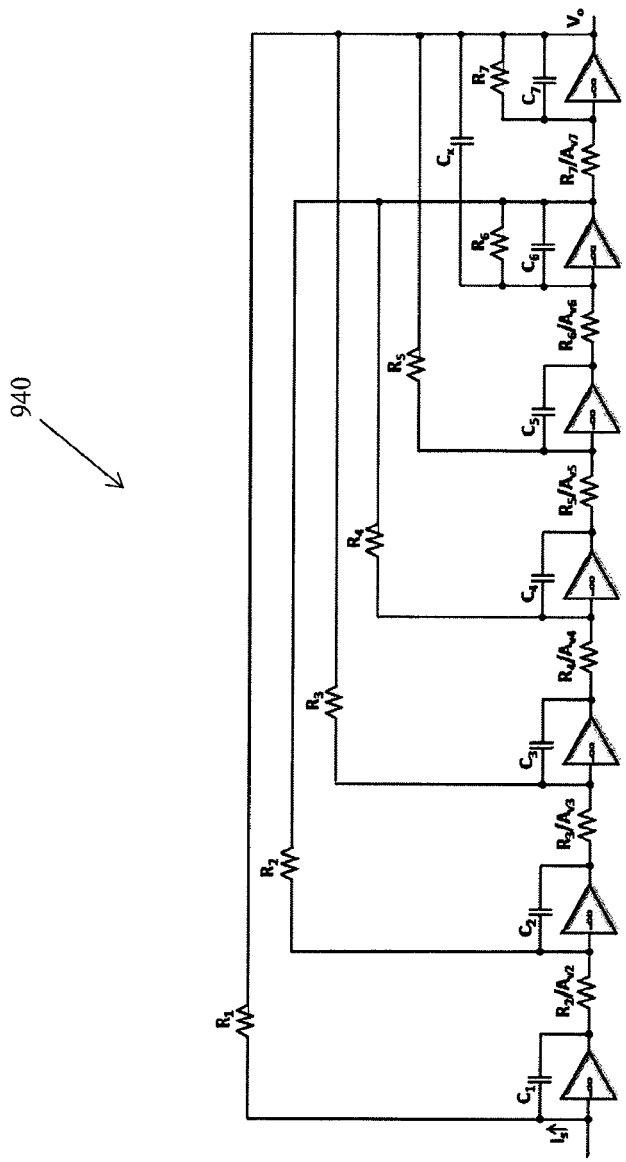
FIG. 9(c) is a schematic diagram illustrating a shaper of seventh order according to one embodiment of the present invention.

FIG. 9(b) illustrates an example of a delayed dissipative feedback applied to a sixth order shaper 920 having six filter stages 922, 924, 926, 928, 930 and 932. FIG. 9(c) illustrates an example of a delayed dissipative feedback applied to a seventh order shaper 940 having seven filter stages.

Figure 9D:
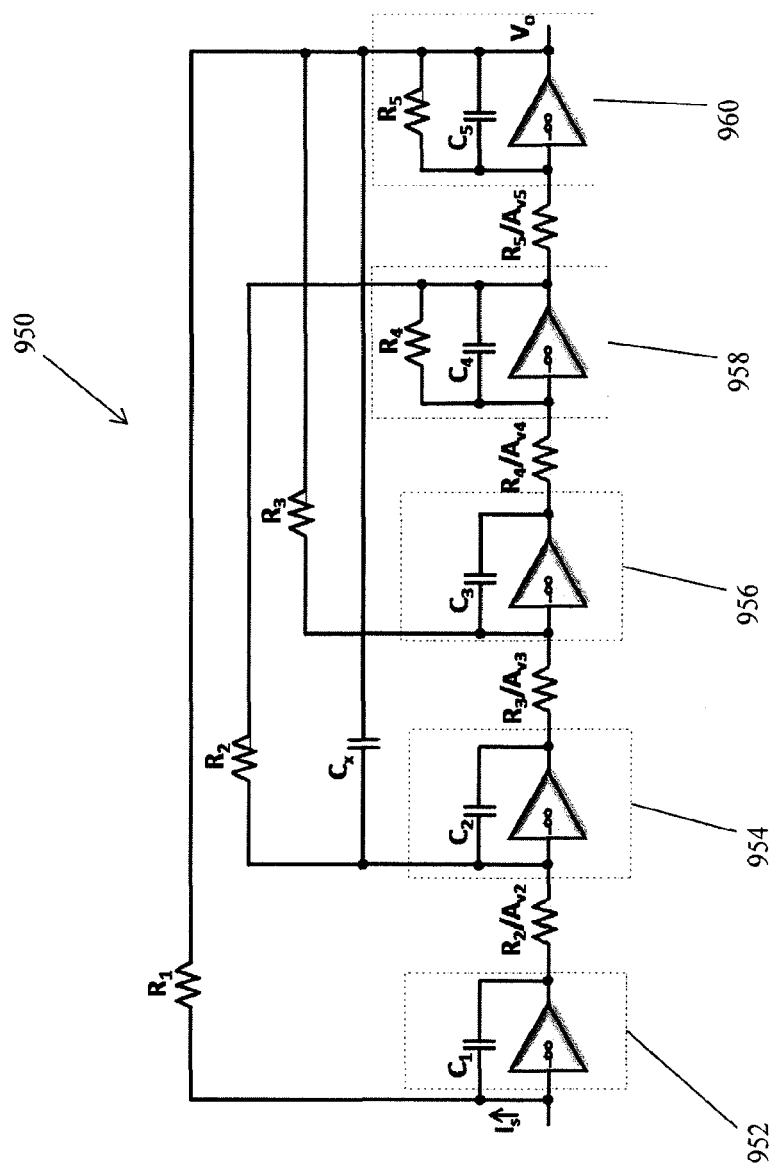
FIG. 9(d) is a schematic diagram illustrating a shaper of fifth order with a positive feedback capacitor across four stages according to one embodiment of the present invention.

FIG. 9(d) illustrates an example of a delayed dissipative feedback applied to a fifth order shaper 950, which includes five filter stages 952, 954, 956, 958 and 960. In FIG. 9(d), a small capacitance $C_x$ in positive feedback, needed to obtain a semi-Gaussian shape, is applied from the output of the last stage, i.e., stage 960, to the input of the second stage 954.

Figure 9E:
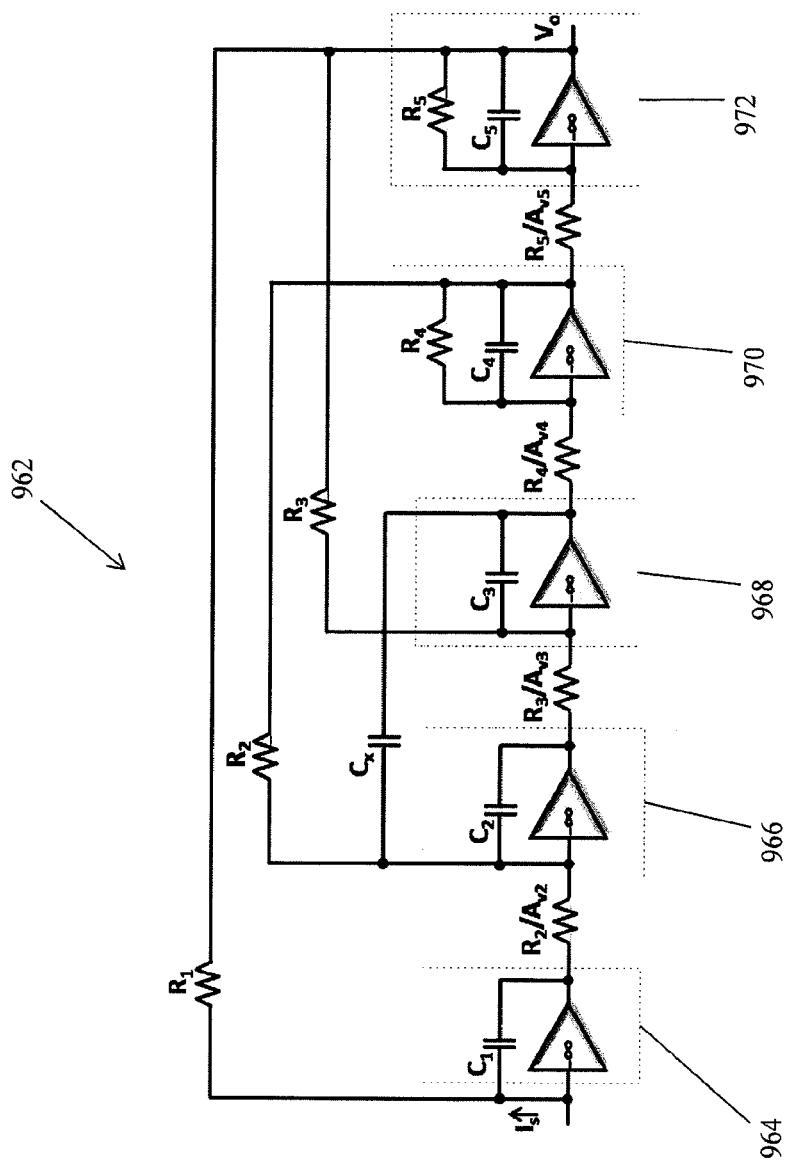
FIG. 9(e) is a schematic diagram illustrating a shaper of fifth order with a positive feedback capacitor across two middle stages according to one embodiment of the present invention.

FIG. 9(e) illustrates an example of a delayed dissipative feedback applied to a fifth order shaper 962, which includes five stages 964, 966, 968, 970 and 972. In FIG. 9(e), a small capacitance $C_x$ in positive feedback is applied from the output of the third stage 968 to the input of the second stage 966.

Figure 9F:
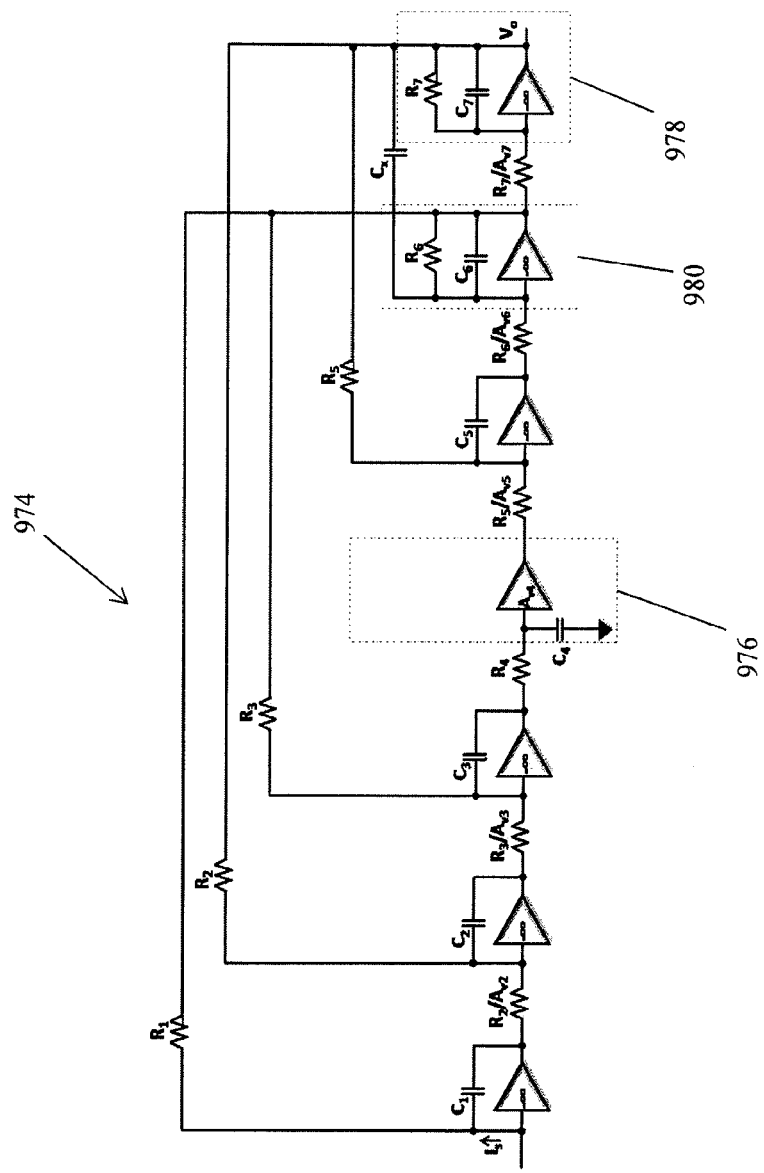
FIG. 9(f) is a schematic diagram illustrating a shaper of seventh order with one non-inverting stage according to one embodiment of the present invention.

FIG. 9(f) illustrates an example of a delayed dissipative feedback applied to a seventh order shaper 974. Compared to FIG. 9(c), the fourth pole, i.e., stage 976, is obtained using a non-inverting configuration. As in all other DDF configurations, resistive negative feedbacks are from the furthest available nodes back to the inputs of inverting amplifiers. In this example a small capacitor $C_x$ in positive feedback is applied from the output of the last stage 978 to the input of the immediately preceding stage 980.

As a design example, a CdZnTe based Gamma-ray detection system is considered, which needs to operate in the 10 keV to 3 MeV range with an electronic resolution better than 1 keV FWHM (e.g., ENC≈90 electrons rms). In a first phase a charge amplifier is designed and optimized in order to meet the required resolution. In doing so a third order semi-Gaussian shaper is used with complex conjugate poles and a peaking time of 500 ns.

The design of the shaper starts from the requirements on the dynamic range and resolution. To keep negligible the noise contribution from the shaper, a $v \geq 11$ in Equation (16) may be selected. Following from Equation (16), Table I, and a CMOS 130 nm technology (i.e., 1.2V and MIM capacitance 2 fF/μm²) we have:

$$\frac{3 \text{ MeV}}{1 \text{ keV}} = 3 \cdot 10^3 \leq \frac{1}{\sqrt{6 \cdot 7 \varepsilon_p 4kT\left(\frac{1+X}{C}\right)}} \quad (27)$$

or $$C \geq 6 \cdot 10^7 \varepsilon_p 4kT(1+X) \approx 960 \text{ } fF\varepsilon_p(1+X)$$

where C is the average capacitance per pole, considering room temperature and a linear operation up to about 100 mV from the rails (i.e., 1 V maximum swing).

Figure 5:
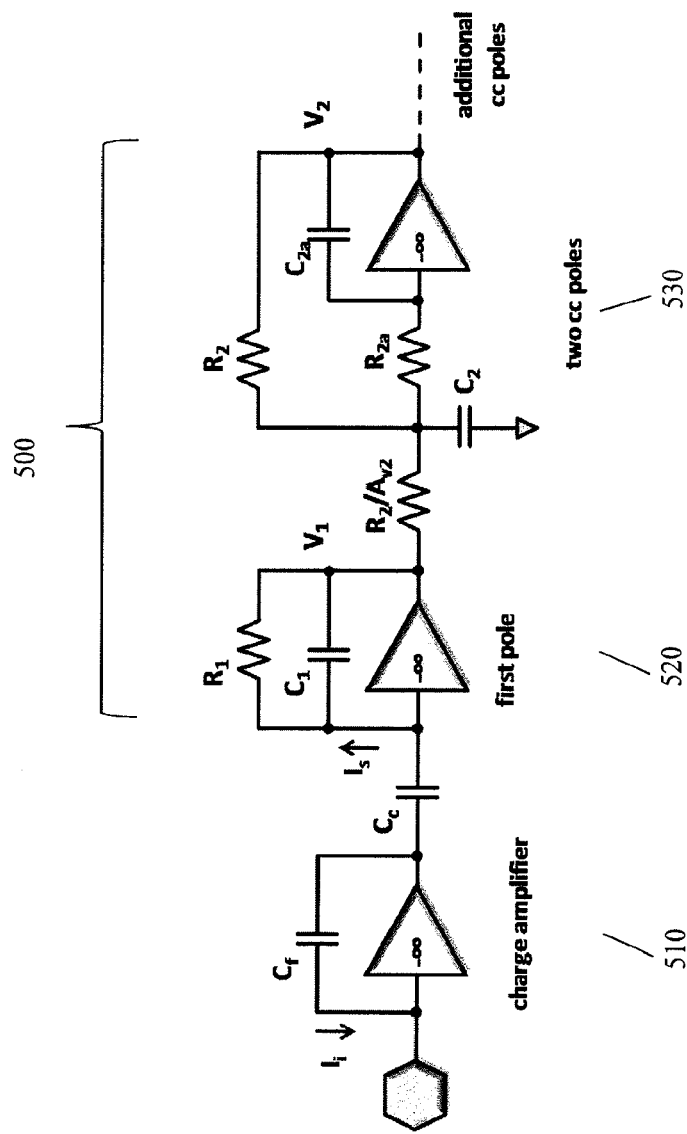
FIG. 5 is a schematic diagram illustrating a charge amplifier followed by a shaper with complex conjugate poles.
Figure 6B:
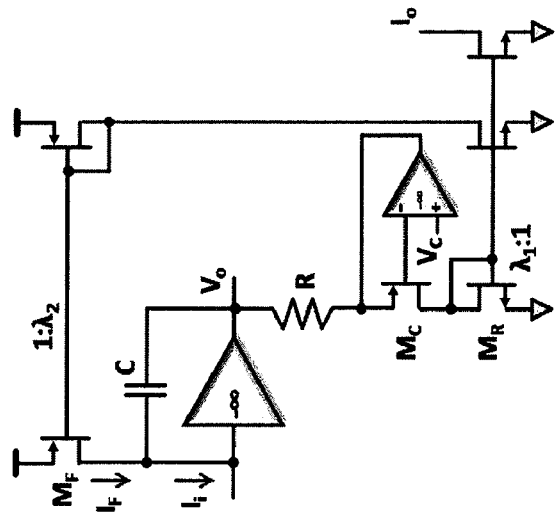
FIG. 6(b) is a schematic diagram illustrating an alternative configuration for realization of low-noise single-pole stages.
Figure 6A:
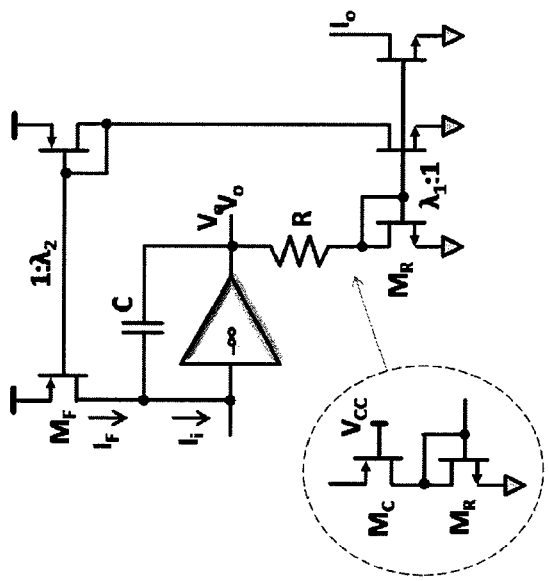
FIG. 6(a) is a schematic diagram illustrating an alternative configuration for realization of low-noise single-pole stages.
Figure 6D:
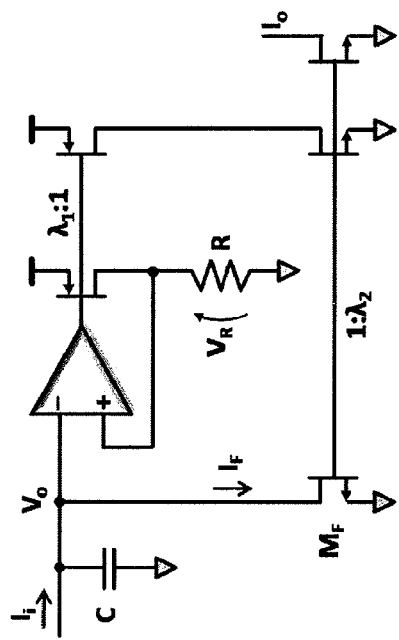
FIG. 6(d) is a schematic diagram illustrating an alternative configuration for realization of low-noise single-pole stages.
Figure 6C:
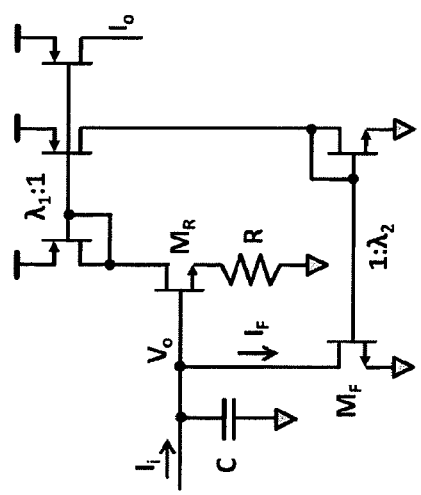
FIG. 6(c) is a schematic diagram illustrating an alternative configuration for realization of low-noise single-pole stages.

If the shaper is designed using the configuration in FIG. 5 as a first case, where $\varepsilon_p \approx 1.79$ and $\chi \approx 5.5$, the total shaper capacitance is $C_{tot} \geq 33.5$ pF, which corresponds to a minimum area of about 16,750 μm² (e.g., ~130 μm×130 μm). If using the configuration in FIG. 8 as a second case, where $\varepsilon_p \approx 0.57$ and $\chi \approx 4.32$, the total shaper capacitance is $C_{tot} \geq 8.7$ pF, which corresponds to a minimum area of about 4,365 μm² (e.g., ~66 μm×66 μm). The required total resistance is ~130 kΩ in the first case and ~560 kΩ in the second case. The corresponding area in the selected technology for linear resistors, characterized by ~350 Ω/square, is in minimum size about 70 μm² and 270 μm², respectively, with regard to the first case and the second case. Once the relatively small area for amplifiers and routings is included, the first case requires at least 18,000 μm² (e.g., about 135 μm×135 μm) while the second 5,000 μm² (e.g., 71 μm×71 μm), with a saving in area of about 72%. Additionally, the value of charge gain $A_c$ is ~107 in the first case and ~28 in the second case, and the current needed to generate the dc voltage drops is more than 10 times lower.

Figure 10A:
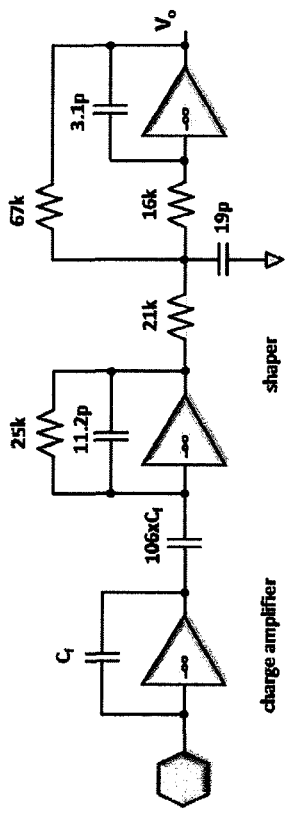
FIG. 10(a) is a diagram illustrating an example of realization using the schematic diagram in FIG. 5.
Figure 10B:
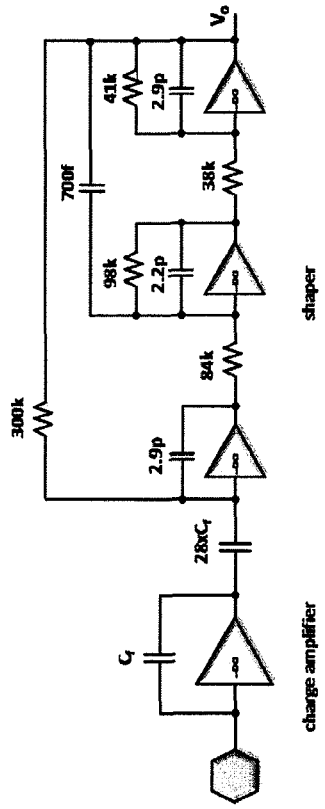
FIG. 10(b) is a diagram illustrating an example of realization using the schematic diagram in FIG. 8.
Figure 10C:
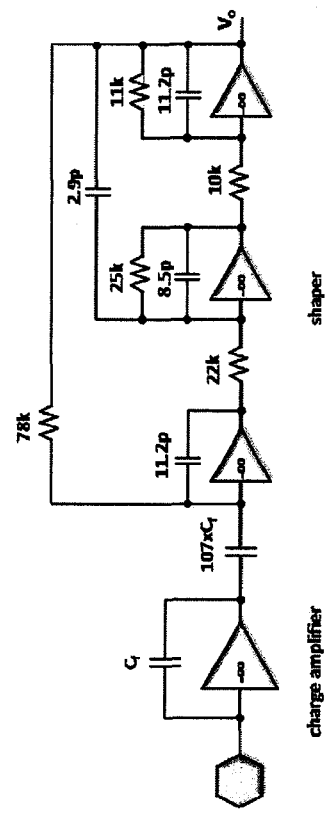
FIG. 10(c) is a diagram illustrating an alternative example of realization using the schematic diagram in FIG. 8.

FIG. 10(a) shows a first case of the realization of a shaper using the circuit in FIG. 5; and FIG. 10(b) shows a second case of the realization of a shaper using the circuit in FIG. 8 at equal dynamic range of the first case. FIG. 10(c) shows a third case where realization of a shaper is done using the circuit in FIG. 8 with a total capacitance equal to that of the first case in FIG. 10(a).

Figure 11B:
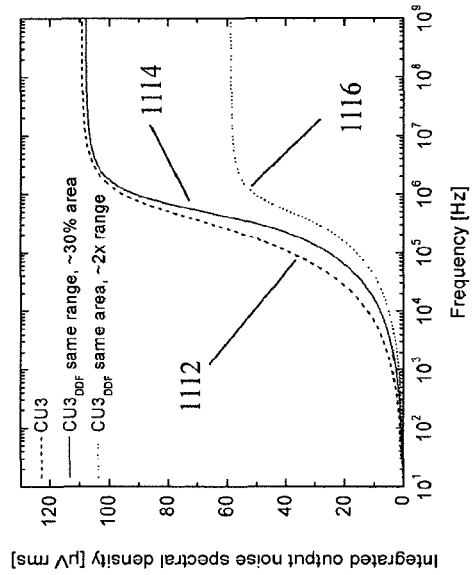
FIG. 11(b) is a graph showing integrated output noise spectral density of a shaper using the circuit in FIG. 10(a), 10(b) and 10(c), respectively.
Figure 11A:
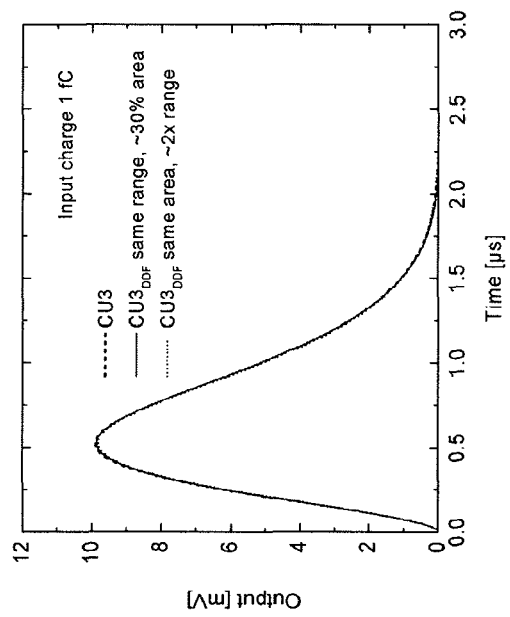
FIG. 11(a) is a graph showing simulated pulse response of a shaper using the circuit in FIG. 10(a), 10(b) and 10(c), respectively.

In FIG. 11(a) the simulations of the pulse response to an input charge of 1 fC is shown, and in FIG. 11(b), the integral of the output noise power spectral density for all three cases in FIG. 10 is shown. As shown in FIG. 11(a), the pulse responses for the three cases in FIGS. 10(a)-10(c) are basically the same. Curve 1112 in FIG. 11(b) is the output noise spectral density of the shaper in FIG. 10(a), and Curves 1114 and 1116 are the output noise spectral density of the shaper in FIGS. 10(b) and 10(c), respectively.

It has been observed from FIGS. 11(a) and 11(b) that, compared to the first case as illustrated in FIG. 10(a), the second case as illustrated in FIG. 10(b) has comparable noise with a capacitance of about four times lower (i.e., a saving in area of about 70%), while the third case as illustrated in FIG. 10(c) has about half of the rms noise at comparable total capacitance. In this simulation the noise contributions from the amplifiers are not included for the previously given reasons. To a first order, the noise contribution from the first amplifier of the shaper depends only on the value of Cf thus being comparable in all three cases.

What is claimed is:

1. An analog filter, comprising:
    a chain of filter stages including at least a first filter stage, a second filter stage, and a third filter stage, wherein:
        the first filter stage includes a first negative-gain amplifier, a first capacitor, a first input node, and a first output node, wherein the first negative-gain amplifier and the first capacitor are positioned between the first input node and the first output node,
        the second filter stage includes a second negative-gain amplifier, a second capacitor, a second filter stage resistor, a second input node, and a second output node, wherein the second negative-gain amplifier, the second filter stage resistor, and the second capacitor are positioned between the second input node and the second output node, and the first output node of the first filter stage is connected to the second input node of the second filter stage through a first resistor,
        the third filter stage including a third negative-gain amplifier, a third capacitor, a third filter stage resistor, a third input node, and a third output node, wherein the third negative-gain amplifier, the third filter stage resistor, and the third capacitor are positioned between the third input node and the third output node, and the second output node of the second filter stage is connected to the third input node of the third filter stage through a second resistor; and
        a feedback resistor effective to provide a negative feedback, wherein the feedback resistor includes a first end and a second end, wherein the first end is connected to an output of the analog filter, and wherein the second end is connected to the first input node of the first filter stage; and
    a feedback capacitor effective to provide a positive feedback, wherein the feedback capacitor includes a third end and a fourth end, wherein the third end is connected to the third output of the third filter stage, the output node of one of the chain of filter stages and the fourth end is connected to the second input of the second filter stage.

2. The analog filter of claim 1, wherein the feedback resistor is a first feedback resistor and the negative feedback is a first negative feedback, the analog filter further comprising a fourth filter stage and a second feedback resistor effective to provide a second negative feedback, wherein:
    the fourth filter stage includes a fourth negative-gain amplifier, a fourth capacitor, a fourth input node and a fourth output node, the fourth output node of the fourth filter stage is connected to the first input node of the first filter stage through a third resistor,
    the second feedback resistor includes a fifth end and a sixth end,
    the fifth end is connected to the second output node of the second filter stage and the sixth end is connected to the fourth input node of the fourth filter stage.

3. The analog filter of claim 1, wherein the third filter stage is a last filter stage in the chain of filter stages, and the output of the analog filter corresponds to the third output node of the third filter stage.

4. The analog filter of claim 1, wherein the first input node of the first filter stage is coupled to a current source.

5. The analog filter of claim 1, wherein an output at the third output node of the third filter stage is voltage.

6. The analog filter of claim 1, wherein the second filter stage further comprises a third resistor and the third filter stage further comprises a fourth resistor.

7. A method for filtering a signal, the method comprising:
    filtering the signal through a chain of filter stages including at least a first filter stage, a second filter stage, and a third filter stage, wherein:
        the first filter stage includes a first negative-gain amplifier, a first capacitor, a first input node, and a first output node,
        the second filter stage includes a second negative-gain amplifier, a second capacitor, a second filter stage resistor, a second input node and a second output node, the first output node of the first filter stage is connected to the second input node of the second filter stage through a first resistor,
        the third filter stage includes a third negative-gain amplifier, a third capacitor, a third filter stage resistor, a third input node, and a third output node, the second output node of the second filter stage is connected to the third input node of the third filter stage through a second resistor; and
    feeding the signal at an output of the chain of filter stages to the first input node of the first filter stage through a negative feedback loop; and
    feeding the signal at the third output node of the third filter stage to the second input node of the second filter stage through a positive feedback loop.

8. The method of claim 7, wherein the feeding of the signal at the output of the chain of filter stages to the first input node of the first filter stage through the negative feedback loop comprises feeding the signal at the output of the chain of filter stages to the first input node of the first filter stage through a feedback resistor.

9. The method of claim 7, further comprising feeding the signal at the second output node of the second filter stage to a fourth input node of a fourth filter stage through a second negative feedback loop, wherein the fourth output node of the fourth filter stage is connected to the first input node of the first filter stage through a third resistor.

10. The method of claim 9, wherein the feeding the signal at the second output node of the second filter stage to the fourth input node of a third preceding the fourth filter stage through the second negative feedback loop comprises feeding the signal at the second output node of the second filter stage to the fourth input node of the fourth filter stage through a feedback resistor.

11. The method of claim 7, wherein the feeding of the signal at the third output node of the third filter stage to the second input node of the second filter stage through the positive feedback loop comprises feeding the signal at the third output node of the third filter stage to the second input node of the second filter stage through a feedback capacitor.

12. The method of claim 7, wherein the feeding of the signal at the third output node of the third filter stage to the second input node of the second filter stage through a positive feedback loop comprises feeding the signal at the third output node of the third filter stage to the second input node of the second filter stage through a feedback capacitor.

* * * * *